US010833698B1

(12) United States Patent
Oliaei et al.

(10) Patent No.: US 10,833,698 B1
(45) Date of Patent: Nov. 10, 2020

(54) LOW-POWER HIGH-PRECISION SENSING CIRCUIT

(71) Applicant: INVENSENSE, INC., San Jose, CA (US)

(72) Inventors: Omid Oliaei, Sunnyvale, CA (US); Peter George Hartwell, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/704,853

(22) Filed: Dec. 5, 2019

(51) Int. Cl.
*H03M 3/00* (2006.01)

(52) U.S. Cl.
CPC .......... *H03M 3/494* (2013.01); *H03M 3/426* (2013.01); *H03M 3/464* (2013.01)

(58) Field of Classification Search
CPC ....... H03M 3/494; H03M 3/426; H03M 3/464
USPC .......................................... 341/143, 144, 119
See application file for complete search history.

(56) References Cited

U.S. PATENT DOCUMENTS

| | | | |
|---|---|---|---|
| 7,545,227 B2 * | 6/2009 | Pernia | H03B 5/04 |
| | | | 331/117 FE |
| 9,976,924 B2 | 5/2018 | Straeusnigg | |
| 2011/0057826 A1 | 3/2011 | Peng | |
| 2014/0225759 A1 | 8/2014 | Peng | |
| 2019/0373376 A1 | 12/2019 | Straeusnigg | |
| 2020/0036284 A1 * | 1/2020 | Qin | H03B 5/1296 |
| 2020/0182707 A1 * | 6/2020 | Badets | G01K 7/32 |
| 2020/0212872 A1 * | 7/2020 | Haroun | H03H 9/02015 |

FOREIGN PATENT DOCUMENTS

| | | |
|---|---|---|
| EP | 2647593 | 10/2013 |
| WO | WO2014150613 | 9/2014 |

* cited by examiner

*Primary Examiner* — Peguy Jean Pierre
(74) *Attorney, Agent, or Firm* — Haley Guiliano LLP; Joshua Van Hoven; Stefan Osterbur

(57) ABSTRACT

A modulator system for converting a current-varying sensor output to a digital representation is disclosed. The modulator system includes a resonator with a first resonator input and a second resonator input. The first resonator input carries a constant reference current and the second resonator input carries a varying input current. In response to a digital output, the resonator generates a complementary voltage output based on a difference between the constant reference current and the varying input current during a conversion time. The resonator resonates near or at zero frequency. An accumulated digital output is based on the accumulation of the digital output generated at each sampling clock cycle of the conversion time and represents a digital word proportional to the varying input current.

31 Claims, 6 Drawing Sheets

LOW-POWER HIGH-PRECISION SENSING CIRCUIT

BACKGROUND OF THE INVENTION

Voltage and current converters are practically staples of electromechanical designs. Sensed physical behavior might be translated to voltage or current signals, ultimately represented by digital values. Current or voltage conversion to digital representation may be implemented by analog-to-digital converters (ADCs) based on delta-sigma modulators, for example.

Delta-Sigma modulator designs can be, and often are, highly application-specific. For example, a voltage-converting modulator circuit can differ drastically in design relative to its counterpart, a current-varying modulator design. Additionally, system requirements and parameters often dictate or at least play a critical role in designing a modulator. A rapidly changing signal characteristic, for instance, may require a different modulator configuration than a slower varying signal that may even be sensed with less costly modulator designs.

MEMS and other systems may have inertial devices such as gyroscopes and accelerometers that are packaged together with a temperature, motion, or acoustic sensor on a single chip. On-chip sensor data (sensed data), generated by a temperature sensor, for example, can exhibit small current variations that pose a challenge to precise current variation measurements. Reliable conversion of small changes in input current to digital representation requires precise modulator measurement characteristics. That is, a modulator design must be adequately robust to maintain system stability while accurately detecting and tracking small current variances.

The device form factor is yet another modulator design consideration. A modulator circuit sharing a common integrated circuit with a sensor device clearly would require a smaller footprint than a modulator device designed onto a printed circuit board. In this respect, a MEMS system employed in a handheld device is typically formed on a semiconductor device with a temperature sensor for tracking temperature changes. The temperature sensor requires capabilities to measure small current variations generated by the temperature sensor accurately. A semiconductor device is not generally liberal in offering an abundance of real estate, therefore, constraining the modulator circuit design even further.

Power consumption is typically another modulator circuit design constraint. Following the above example, power consumption can directly impact handheld devices' charging times and rates and even adversely affect their operation.

Complexity of a modulator circuit design is yet another design factor. An intricate modulator design typically requires a higher number of components limiting its applicability to a broader array of applications than likely otherwise realized. For example, the preceding handheld device example with an on-chip sensor-modulator circuit pair is an unlikely option for a modulator with a large footprint.

Existing modulator designs for sensing current suffer from at least some of the above-identified shortcomings. Take, for example, a modulator design with two or more integrators. While the modulator performance may be acceptable, a large footprint and high-power consumption effectively eliminate the modulator as a serious contender for single-chip applications. Perhaps more importantly, small current-carrying signals, like signals generated by a temperature sensor, are imprecisely measured.

SUMMARY

A system for converting a current-varying sensor output to a digital representation is disclosed. The system includes a resonator having two resonator inputs. One of the resonator inputs carries a constant reference current, and the other resonator input carries a varying input current. In response to a digital output, the resonator is configured to generate a complementary voltage output based on a difference between the constant reference current and the varying input current at each sampling clock cycle during a conversion time. The resonator resonates near or at zero frequency. An accumulated digital output based on accumulation of the digital output at each of the sampling clock cycles during the conversion time is represented by a digital word proportional to the varying input current.

A method for converting a current-varying sensor output to a digital representation is disclosed. The method includes receiving a current-varying input from a current-generating sensor. During a conversion time, in response to a digital output, a constant reference current is compared with the varying current, and a voltage output based on the comparison is generated. At a sampling clock cycle, the voltage output is digitized to create the digital output. For all subsequent sampling clock cycles of the conversion time, the comparing, generating, and digitizing steps are repeated to produce an accumulated digital output during the conversion time based on an accumulation of the digital output at each sampling clock cycle. The accumulated digital output represents a digital word that is proportional to the variations in the input current.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION OF DRAWINGS

Figure 1:
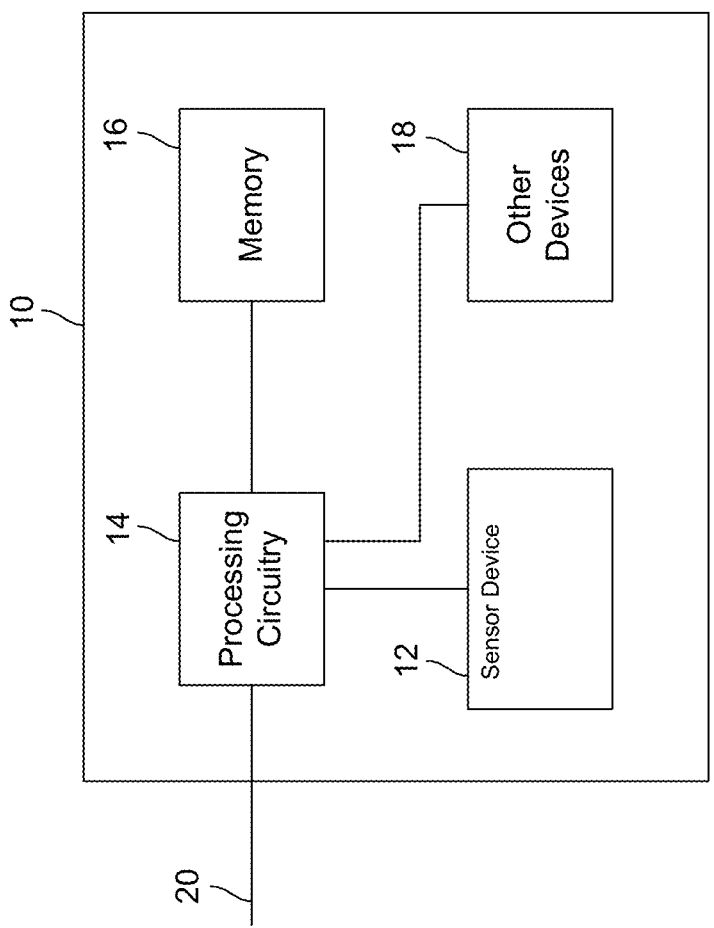
FIG. 1 depicts a sensing system in accordance with at least some embodiments of the present disclosure.

A current-producing device, such as a microelectromechanical (MEMS) sensor or other sensors, generates small current-varying outputs that represent physical or environmental device behavior, such as temperature, motion, pressure, acoustics, etc., changes. A motion sensor may output sensed device displacements or rotations in the form of current variations. A temperature sensor may produce current-varying outputs in response to detected temperature changes. Similarly, an acoustic sensor or a pressure sensor may provide current-varying outputs based on sensed acoustics changes or device pressure changes to a device, respectively.

In some applications, a current-producing sensor, such as without limitation, an accelerometer, a gyroscope, a magnetometer, or a compass, generates signals with small current variations. The current variations may represent environmental changes, such as, without limitation, temperature, pressure, or motion changes. In an exemplary application, a temperature sensor may be on-board the same chip with an inertial device, such as a gyroscope. The temperature sensor may detect changes to the temperature of the gyroscope for correcting errors in the measurement of the Coriolis force. But the sensed signals typically carry variations too small for precise current variation measurements.

The current variations are typically rendered more meaningful if ultimately converted to digital representation for further signal processing, for example. Accordingly, a modulator, functionally behaving like an ADC, converts input current variations to voltage levels that, when accumulated over a span of clock cycles proportionally and precisely represents the input current variations. Based on the input current range and other factors, the modulator is designed to precisely measure and report the changes to the input current in digital form.

The modulator translates the current variances, which are in analog form, to voltage variations and converts the voltage variations to a digital value at each sampling clock cycle of a conversion time. Additionally, the modulator accumulates the digital value produced at each sampling clock of the conversion time to generate a digital word at the end of the conversion time. The digital word is an accurate proportional digital representation of the variations in the analog input current.

The modulator design simplicity and small footprint makes the modulator a formidable candidate for a wide variety of applications. The above-noted on-chip modulator-sensor combination in a handheld device is one example.

The modulator may implement a crude one-bit quantizer to digitize the voltage variations while generating precise results. The one-bit quantizer granularity would normally lead to inaccurate measurements, but the modulator is designed to compensate for the coarse quantization using an iterative process. Over a large number of sampling clock cycles in a conversion period, the modulator accumulates a sequence of digital outputs forming a digital word at the end of the conversion time. The digital output is fed back to the input of the modulator to improve measurement accuracy at each sampling clock cycle.

In addition to the iterative process, oversampling contributes to precise current variation measurements. The modulator is made to operate faster during conversion compared to the rate at which the digitized results of the conversion are furnished. In an exemplary implementation, the sampling clock rate at which digital outputs are generated is significantly higher than a data clock rate at which the digitized results are generated.

The feedback path between a modulator quantizer and the modulator resonator further contributes to precise current variation measurements. With each sampling clock iteration in a conversion time, the modulator output is improved. The modulator generates a sequence of one or more bits with each sampling clock cycle during a conversion period, and a digital filter or accumulator converts the sequence of bits to a digital word. The digital word is a proportional digital representation of variations in the input current. Even the smallest input current variations are picked up through the iterative accumulations. Generally, the greater the number of iterations, the more precise the digital result.

The circuit configuration of the modulator resonator and its surrounding circuits are key to system stability, dynamic range, voltage swings, power consumption, and noise tolerance, among other modulator characteristics. Circuit component ratios and relationships, in large part, define the specific modulator performance. System requirements generally dictate the relationship between various resonator circuit and surrounding components. Design choices, such as noise and power consumption tolerances, help to define the components' values, such as resistances and capacitances.

Corresponding resonator and surrounding circuit components of the modulator track each other to cancel the effects of manufacturing process variations.

In some embodiments, a single-ended current source is converted to a differential voltage output to accommodate the modulator resonator because the resonator is inherently an unstable device. Further, given the inherently unstable nature of resonator circuits, the feedback loop, external to the loop filter, is designed into the modulator to stabilize the resonator. The positive feedback path requires cross-coupling and accommodating cross-coupling; the resonator generates a complementary or out-of-phase voltage output that, when quantized, is fed back to the input of the resonator through the outer feedback path. Because the input current is single-ended and the resonator configuration is differential, component relationships and connections are carefully designed to ensure proper current sensing and resonator stability.

In some embodiments, the resonator components are configured to effectuate a direct current (DC) modulator design, i.e., the modulator resonates with a zero frequency. This type of modulator configuration allows for a simpler circuit design with fewer circuit components than modulators using integrators.

In an embodiment, complimentary switching of symmetrical resonator circuits surrounding a resonator amplifier contributes to implementing a precision differential circuit design implementation. While a first-order system can yield precise results, a second, fourth, or even higher-order designs reduce convergence times and, therefore, modulator efficiency. In some cases, convergence speed increases at the cost of power consumption.

In an embodiment, the quantizer has a successive approximation (SAR) configuration, reducing power consumption even further.

A multi-bit quantizer design further reduces convergence time or increases measurement accuracy.

In some embodiments, the modulator is configured as a continuous-time circuit. In some embodiments, the modulator is configured as an incremental modulator and may be reset before the start of each conversion time while running continuously with not resets during the conversion time. In applications with slow-varying current changes, such as temperature variations from sensors, a current-varying modulator design, particularly one with iterative processing, can generate precise outputs with less noise and more efficient power consumption.

FIG. 1 depicts a sensing system in accordance with some embodiments of the present disclosure. In FIG. 1, an exemplary sensing system 10 is shown to include at least a sensor device 12, and supporting circuitry, such as processing circuitry 14 and memory 16. Although particular components are depicted in FIG. 1, it will be understood that other suitable combinations of sensors, processing components, memory, and other circuitry may be utilized as necessary for different applications and systems. In some embodiments, one or more additional MEMS devices 18 may include MEMS devices (e.g., MEMS gyroscopes, MEMS accelerometers, MEMS microphones, MEMS pressure sensors, temperature sensors, and a compass).

Processing circuitry 14 may include one or more components providing necessary processing based on the requirements of the sensing system 10. In some embodiments, processing circuitry 14 may include hardware control logic that may be integrated within a chip of a sensor (e.g., on a substrate or cap of a sensor device 12 or other MEMS device 18, or on an adjacent portion of a chip to the MEMS gyroscope 12 or other MEMS device 18) to control the operation of the sensor device 12 or other MEMS devices 18 and perform aspects of processing for the sensor device 12 or other MEMS devices 18. In some embodiments, the sensor device 12 and other MEMS devices 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the sensor device 12 by interacting with the hardware control logic, and process signals received from sensor device 12. The microprocessor may interact with other sensors similarly.

Although in some embodiments (not depicted in FIG. 1), the sensor device 12 or other MEMS devices 18 may communicate directly with external circuitry (e.g., via a serial bus or direct connection to sensor outputs and control inputs), in an embodiment the processing circuitry 14 may process data received from the sensor device 12 and other MEMS devices 18 and communicate with external components via a communication interface 20 (e.g., a SPI or I2C bus, or in automotive applications, a controller area network (CAN) or Local Interconnect Network (LIN) bus). The processing circuitry 14 may convert signals received from the sensor device 12 and other MEMS devices 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS devices, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications. The sensors may detect changes in device behavior, such as variations in temperature, acoustics, or motion. Alternatively, each sensor may detect changes in different device behavior, or a combination of sensors may detect changes in a device behavior that is different than the device behavior sensed by one or more remaining sensors. Various device behavior, experienced by a sensor, is represented and output in the form of current variances by the sensor. In some applications, a sensor may generate an analog (or continuous) current-varying signal carrying small current variations in response to physical or environmental device changes, such as device temperature changes. For example, a temperature sensor may detect increased temperature changes to an on-chip inertial device due to an inertial device malfunction or due to environmental changes, in response to which the temperature sensor generates a current-varying output reflecting the inertial device temperature changes.

Figure 2:
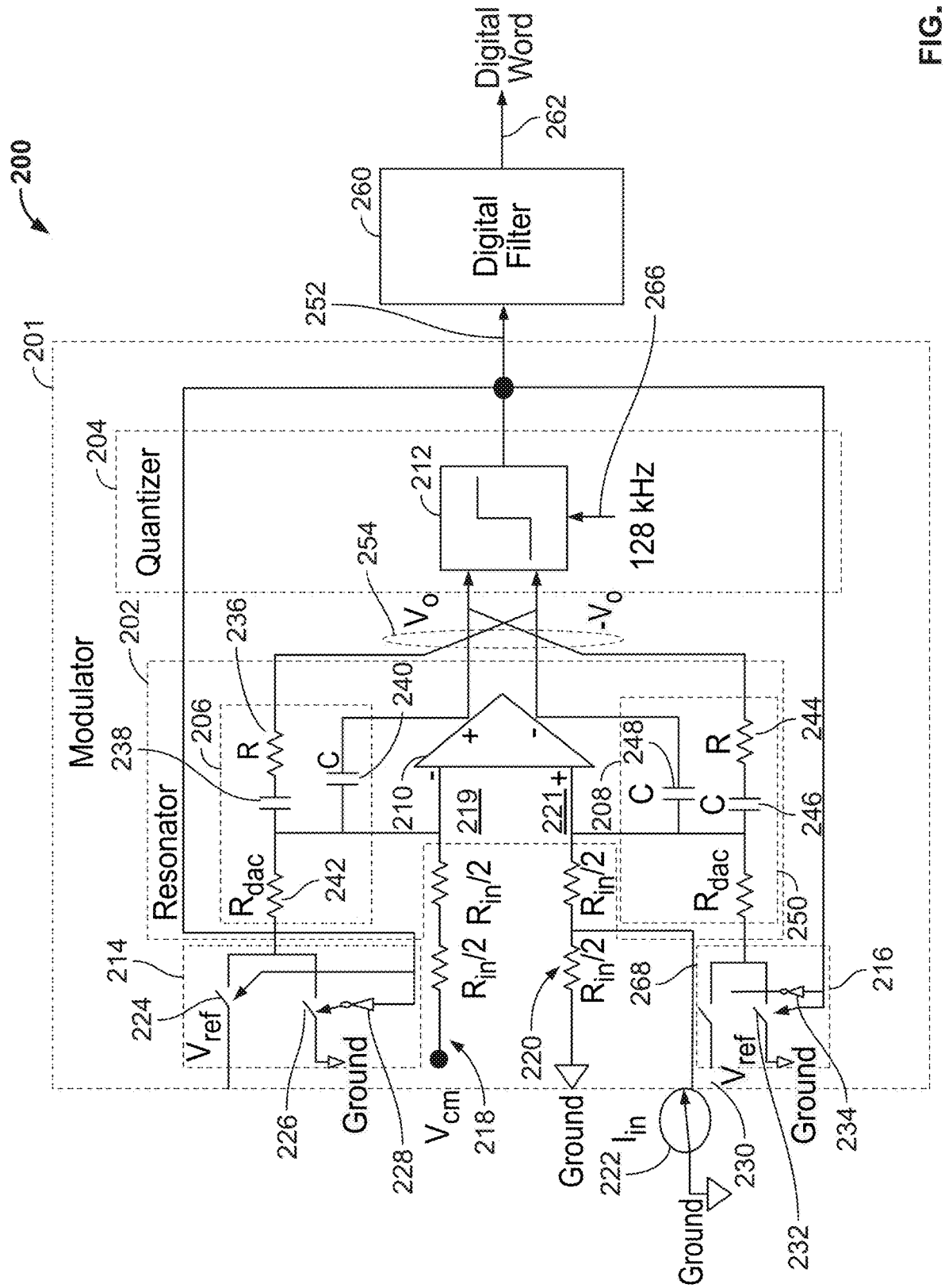
FIG. 2 shows a current-converting modulator system in accordance with at least some exemplary disclosures.

FIG. 2 shows a current-converting modulator system in accordance with various exemplary disclosures. In FIG. 2, a current-converting modulator system 200 is shown in accordance with a disclosed embodiment. The modulator system 200 includes a modulator 201 and a digital filter 260. In accordance with an embodiment, the modulator 201 includes a resonator 202 and a quantizer 204. The modulator system 200 receives current-varying input 268. In response to input 268, the modulator system 200 generates a digital word 262 proportional to the variances in the input 268.

Current-varying input 268 may be generated by a current-producing device 222, such as, without limitation, a temperature sensor. The sensor generates input to the modulator system 200 and behaves like a current source, producing current-varying signals in response to a behavioral or environmental change, such as temperature, in a sensed device, such as, without limitation, a gyroscope. It is understood that the current-producing device 222 may be any type of current-producing sensor, including, without limitation, a motion, pressure, acoustic, or other suitable types of sensors.

In an embodiment, device 222 may comprise, in part or in its entirety, sensor device 12, other sensor devices 18, or a combination thereof. In some embodiments, current-producing device 222 is a MEMS device; for example, a gyroscope that detects device displacements or a temperature sensor that detects temperature variations experienced by a gyroscope.

Current-varying input 268 is generally an analog signal that is continuous in time. In some embodiments, current-varying input 268 carries small varying current. For example, current-varying input 268 may carry current in the range of nano amps to micro amps.

Resonator 202 generates a differential voltage 254 which is quantized by the quantizer 204 to generate a digital output 252, a digital signal that may be "N" bits wide, "N" may represent an integer or a real number. The number of digital output bits can be determinative of the quantizer 204 resolution. For example, a single bit (N=1) digital output 252 represents two distinct logical states, "1" and "0", a rather coarse digital measure of input current variations. Whereas, a 3-bit digital output 252 represents up to 8 logical states, a finer granularity with a greater accuracy result. Quantizer 204 includes a voltage comparator 212, as further explained below.

In some embodiments, digital filter 260 accumulates (or adds) the digital output at a previous sampling clock cycle with the digital output at a current sampling clock cycle and accumulates the digital output at the current sampling cycle with the digital output at the next sampling cycle, and so on, to generate an accumulation of the digital outputs at each sampling clock and to ultimately generate digital word 262 from the accumulated digital outputs, at the end of a conversion time.

As shown in FIG. 2, resonator 202 includes two differential circuits 206 and 208, and an amplifier 210. Differential circuits 206 and 208 of resonator 202 are coupled to two complimentary switching circuits 214 and 216, respectively. Two input circuits 218 and 220 feed two resonator inputs, 219 and 221, respectively. Resonator 202 is further configured to generate complementary voltage output 254 representing voltage level variations proportional to the variations in the current of input 268.

A negative feedback path, external to resonator 202, couples the output of quantizer 204 (digital output 252) to the switching circuits 214 and 216. In the exemplary configuration of modulator 201, digital output 252 is coupled to the switching circuits 214 and 216, causing complementary switching of the circuits 214 and 216, further described below. The feedback path brings stability to the resonator 202.

Amplifier 210 can be any amplifier circuit suitable for amplifying inputs and generating complementary voltage outputs proportional to the current difference between the resonator inputs. In an embodiment, amplifier 210 is a differential amplifier. In some embodiments, amplifier 210 maybe a chopper amplifier to reduce component mismatch effects and flicker noise.

While amplifier 210 is shown to receive two inputs 219 and 221 in FIG. 2, it is understood that amplifier 210 may have additional inputs. For example, a differential input pair in addition to the input generated from the input current may be coupled to amplifier 210.

For reasons previously discussed, amplifier 210 is configured to generate a differential output 254. Output 254 includes two voltage outputs with opposite polarity (or out-of-phase). The single-ended input 268 is accordingly converted to the differential voltage output 254. Output 254 carries varying voltage levels, each voltage level tracking the difference between the currents carried by inputs 219 and 221. Input 219 of amplifier 210 is an inverting input, while input 221 of amplifier 210 is a non-inverting input. Input 219 is further coupled to the differential circuit 206 and input 221 is further coupled to matched circuit 208.

Output 254 comprises two distinct voltage outputs, a positive polarity output (+Vo) and a negative polarity output (−Vo). Each voltage output crosses over so that +Vo feeds matching circuit 208 and −Vo feeds differential circuit 206, a cross-coupling effect. Cross-coupling is required to create positive feedback for the implementation of the resonator. Component design symmetry, such as differential circuits 206 and 208 surrounding amplifier 210, in addition to matched input components to amplifier 210, are also essential to precise current sensing.

In an embodiment, input circuit 218 is configured as a voltage divider, and input circuit 220 is configured as a current divider. Input circuit 218 includes a set of resistors coupled in series. The series-coupled resistor pair is coupled to a common-mode voltage (Vcm) at one end and to amplifier input 219 at an opposite end. Input circuit 220 includes a resistor pair coupled in parallel. The parallel-coupled resistor pair is coupled to virtual ground ("ground" or "Ground") at one end and to amplifier input 221 at an opposite end. At a node coupling the two resistors, input 268 is received from device 222.

In an embodiment, the resistors of circuits 218 and 220 are matched, sharing the same or very near resistance values and sizes compensating for manufacturing process variances to increase reliability and current variation measurement accuracy.

Corresponding components of each of differential circuits 206 and 208 are also matched for similar reasons. For example, the resistors of differential circuit 206 match corresponding resistors of differential circuit 208 and capacitors of differential circuit 206 match corresponding capacitors of differential circuit 208.

In an exemplary modulator configuration, differential circuit 206 includes resistors 242 and 236, capacitor 238, and feedback capacitor 240. Resistor 242 is coupled between switching circuit 214 and capacitor 238. Feedback capacitor 240 couples +Vo of amplifier 210 to the inverting input (input 219) of amplifier 210. Capacitor 238 and resistor 236 are coupled in series and between −Vo of amplifier 210 and the inverting input (input 219) of amplifier 210.

In an exemplary modulator configuration, differential circuit 208 includes resistors 250 and 244, capacitor 246, and feedback capacitor 248. Resistor 250 is coupled between switching circuit 216 and capacitor 246. Feedback capacitor 248 couples −Vo of amplifier 210 to the non-inverting input (input 221) of amplifier 210. Capacitor 246 and resistor 244 are coupled in series and between +Vo of amplifier 210 and the non-inverting input (input 221) of amplifier 210.

In accordance with some embodiments, resonator 202 includes resistor-switch circuit combinations arranged in a symmetrical configuration relative to amplifier 210. The number of resistor-switch combination pairs may be based on the number of quantizer resolution—the number of quantization bits, or "N". For example, 16 resistor-switch combinations coupled to amplifier input 219 and 16 others coupled to amplifier input 221 may be based on a 4-bit quantizer. An example of a resistor-switch combination is resistor 242 and switching circuit 214, another example combination is resistor 250 and switching circuit 216. Each of the resistor-switch combinations effectively functions as a digital-to-analog converter (DAC).

Each of the feedback capacitors 240 and 248 is switched on and off, under the control of digital output 254 during each sampling clock cycle to charge and discharge.

In some embodiments, resistors 242 and 250 are matched, and resistors 244 and 236 are matched, capacitors 246 and 238 are matched, and capacitors 248 and 240 are matched. In some embodiments, components of the same amplifier input circuit may be matched. For example, resistors 244 and 246 may be matched, and capacitors 248 and 246 may be matched. Similarly, resistors 242 and 236 may be matched, and capacitors 240 and 238 may be matched.

Digital output 252 is generated by quantizer 204 and fed back as a control input to the feedback switches, thus forming an external (negative) feedback path to resonator 202.

Switching circuits 214 and 216 are each complimentarily switched under the control of output 252 to accommodate the overall negative feedback of the modulator. Output 252 serves as a control signal controlling the switches of circuits 214, 216. When causing circuit 214 to switch from one state to another state, output 252 necessarily causes the remaining switching circuit, circuit 216, to switch to an opposite state. For example, when output 252 is at logic state "1", switching circuit 214 and 216 are at opposite switching states and similarly, and when output 252 is at logic state "0", switching circuit 214 and 216 are similarly at opposing switching states. Switching circuits 214, 216 may each switch between virtual ground and a reference voltage (Vref) such that when switching circuit 214 is caused (by digital output 252) to switch to Vref, switching circuit 216 is caused to switch (by digital output 252) to ground and when switching circuit 214 is caused (by digital output 252) to switch to ground, switching circuit 216 is caused to switch to Vref (by digital output 252). Accordingly, switching circuits 214 and 216 have complimentary switching configurations. Alternatively, switching circuits 214, 216 may each switch between VDD, a voltage other than Vref, and Vref.

In an embodiment, switching circuit 214 includes a switch 224, a switch 226, and an inverter 228. Digital output 252 controls switch 226 through inverter 228, while digital output 252 directly controls switch 224. Both switches 224, 226 are coupled to differential circuit 206 at one end. At the opposite end, switch 224 is coupled to Vref, and at an opposite end, switch 226 is coupled to virtual ground. Accordingly, digital output 252 either causes switch 224 to switch to ground, therefore causing switch 226 to switch to Vref (at the same time) or causes switch 224 to switch to Vref, therefore, causing switch 224 to switch to ground (at the same time).

In an embodiment, switching circuit 216 includes a switch 230, a switch 232, and an inverter 234. Digital output 252 controls switch 230 through inverter 234, while digital output 252 directly controls switch 232. Both switches 230, 232 are coupled to matched circuit 208 at one end. At the opposite end, switch 230 is coupled to Vref, and at an opposite end, switch 232 is coupled to virtual ground. Accordingly, digital output 252 either causes switch 230 to switch to ground, therefore causing switch 232 to switch to Vref (at the same time) or causes switch 230 to switch to Vref, therefore, causing switch 232 to switch to ground (at the same time).

In operation, input circuit 220 divides input 268 by a factor determined by the value of Rin. The value of Rin is, at least in part, based on the input current range and Vcm. In an exemplary embodiment, Vcm is set equal to Vref, and Vref is approximately half of a supply voltage. For example, with a supply voltage supplying 1.5 volts (V), Vref and Vcm are each 0.75V. Setting Vcm to half of the supply voltage helps to maximize the dynamic range of the system. It is understood that the relationship between Vcm, Vref, and the supply voltage and their respective values may deviate from those disclosed herein.

Input circuit 218 divides Vcm and Vref to produce input 219 with a voltage that is related to Vcm and Vref based on the value of Rin. In an exemplary embodiment, the voltage at input 219 is equal to Vcm. Input 219 carries a constant current, Iref, a fraction of the current proportional to Vref and Vcm. Vcm is a constant voltage; therefore, Iref is a constant current. Vref serves as a reference voltage; therefore, Iref serves as a reference current. The varying current (derived from input 268) on input 221 is subtracted from the reference current, Iref, by amplifier 210.

In an embodiment, the resistance of each of the resistors of circuits 218 and 220 is equal; for example, each is Rin/2. The resistors track each other, i.e., each is Rin/2, for a more accurate comparison of the fixed reference current carried by input 219 and the varying current carried by input 221. Therefore, matching components on inputs 219 and 221 cause more precise comparison results.

Amplifier 210 subtracts the varying current carried by input 221 to the constant current (Iref) carried by input 219 and generates differential voltage output 254 in response to the difference between the two currents. At each sampling cycle of sampling clock 266, complimentary voltage output 252 is sampled and digitized to one- or more-bits by a voltage comparator 212 of quantizer 204 to generate digital output 252. Digital output 252 controls the switching of switching circuits 214 and 216 in a complementary fashion, as previously explained.

In an embodiment, the symmetrical configuration of differential circuits 206 and 208 relative to amplifier 210 determines the relative complementary voltages of voltage output 254. That is, the greater the symmetrical configuration of differential circuits 206 and 208, the closer the absolute value of the complementary voltages (+Vo and −Vo) of output voltage 252 to each other.

Resistor 242 generates a current based on the state of the switching circuit 214. Similarly, resistor 250 generates a current based on the state of the switching circuit 216. In an embodiment, the resistance of each resistor 242, 250, is determined based on the range of input 268.

Each of the resistors 242 and 250 couples either Vref or ground, based on the state of a respective switching circuit 214, 226 (as determined by digital output 252), to a respective capacitor 238, 246. When switching from Vref to ground or vice versa, capacitors 238, 246 are charged or discharged by resistors 242, 250 to appropriate values.

In an embodiment, resistors 242 and 250 are matched, contributing to the symmetry of differential circuits 206, 208. Resistor 236 and capacitor 238 collectively define the RC (or time) constant of input 219 of amplifier 210. Similarly, resistor 244 and capacitor 246 collectively define the RC (or time) constant of input 221 of amplifier 210. In an embodiment, each RC time constant is based on the sampling clock 266 and the transfer function of the system 200. The order of system 200 is generally described by a transfer function. For example, in the presence of a single pole, the system is a first order transfer function and two poles, renders the system a second-order system. The embodiment of FIG. 2 is a second-order system.

In an embodiment, resistor 236 and resistor 244 are matched, and capacitors 238 and 246 are matched. Capacitor 240 serves as a feedback capacitor for input 219 of amplifier 210, and capacitor 248 serves as a feedback capacitor for input 221 of amplifier 210. The resistance and capacitance of each RC is a matter of design choice and generally subject to noise and power consumption requirements.

In an embodiment, capacitors 238 and 240 share the same capacitance and capacitors 246 and 248 share the same capacitance, therefore causing modulator 201 to be configured as a DC modulator. A modulator resonating at a frequency higher than zero would have one or more resistors at each input of the amplifier, and the resistors would have different resistances. The relatively simple circuit design with a smaller form of modulator 201 is, at least in part, attributable to the DC configuration of modulator 201.

"Icm" is the current flowing through resistors Rin towards input 219 of amplifier 210 and proportional to Vcm. In an exemplary embodiment, Icm corresponds to the mid-point value of the entire range of input 268 to maximize the dynamic range of system 200. For example, if the input current is in a range of 0-10, Icm is 5. In another example, if the temperature being measured is (in degrees Celsius) −40° C.-+120° C., a 160-degree range, the temperature mid-point would be half of 160 plus the minimum temperature or minus the maximum temperature, 80° C.+−40° C. or 120−80, or +40° C. degrees. The current mid-point may be determined based on the temperature mid-point for maximum dynamic range effect. The following equations further describe the foregoing relationships. The transfer function of resonator 202 is as follows:

$$H(s)=Vo(s)/Iin(s) \text{ OR Output Voltage}(s)/\text{Input Current}(s)=-(1+RCs)/RC^2S^2 \quad \text{Eq. (1)}$$

Where "H(s)" represents the system transfer function in the "s" domain; "Vo(s)" represents output voltage 254; and "Iin(s)" represents half of input 268.

$$Vcm/2=I\text{mid-point}*(Rin/4) \text{ OR } 40° \text{ C.}*(Rin/4) \text{ in the above example;} \quad \text{Eq. (2)}$$

where "Imid-point" is the mid-point value of the current range of input current 258.

$$Rin=2*Vcm/\text{Imid-point OR } Rin=2*Vcm/40° \text{ C. in the above example.} \quad \text{Eq. (3)}$$

$$Icm=\text{Imid-point}=2Vcm/Rin \quad \text{Eq. (4)}$$

$$Idiff=\text{Imid-point}-Icm; \quad \text{Eq. (5)}$$

where "Idiff" represents the difference in current between inputs 219 and 221 of amplifier 210.

$$\text{Digital Output 252 is proportional to } (Imid\text{-point}-Icm)/Idac; \quad \text{Eq. (6)}$$

where "Idac" is the current flowing through resistor 242 and resistor 250, assuming resistors 242, 250 are matched.

In an embodiment, the resistances of Rdac 242 and 236 are the same or near the same, and the resistances of Rdac 250 and 244 are the same or near the same to maximize the dynamic range of the modulator 201.

To accommodate a multi-bit quantizer configuration, unlike the embodiment of FIG. 2, resonator 202 would be designed with more than one feedback circuit at each input of amplifier 210. For example, in a 2-bit configuration, each of the differential circuits 206 and 208 would be coupled in parallel with another differential circuit. Accordingly, the number of stages (or matching circuits) is based on the number of quantizer bits.

Input 268 is an analog (or continuous in time) signal that is converted to an analog voltage output 254 by resonator 202. At each sampling clock 266, output voltage 254 is converted to digital form by voltage comparator 212 of quantizer 204 during a given conversion time. For example, during a conversion time, modulator 201 generates a digital output at output 252 at each sampling clock 266 for a total of 640 sampling clocks. In the one-bit quantizer implementation of FIG. 2, at each sampling clock, quantizer 204 generates one bit. For instance, if the voltage level at voltage output 254 is above a threshold, quantizer 204 declares a logical state of "1" at digital output 252, and if voltage output 254 is below a threshold, quantizer 204 declares a logical state of "0" at digital output 252. Accordingly, 640 bits of data are accumulated by digital filter 260 during each conversion time. Digital filter 260 generates digital word 262, formed of the 640 digital bits, at the end of the conversion, at a rate determined by a data clock rate, such as the data clock rate of data clock shown in FIG. 4. In an embodiment, the data clock rate is determined by the sampling clock speed divided by the number of clock cycles in a conversion period. Following the above example, a sampling clock rate of 128 kHz with 640 clock cycles in a conversion period yields a data clock rate of 200 Hz. That is, a digital word proportional to the variations in input 268 is generated at a rate of 200 Hz, an oversampling of 128 kHz to 200 Hz. Oversampling facilitates precise current variation measurement. Indeed, additional clock cycles in a conversion time allows additional accumulation results or decreased measurement error—1000 sampling clock cycles in a conversion time yields more precise results than 640 clock cycles in a conversion time.

Figure 3:
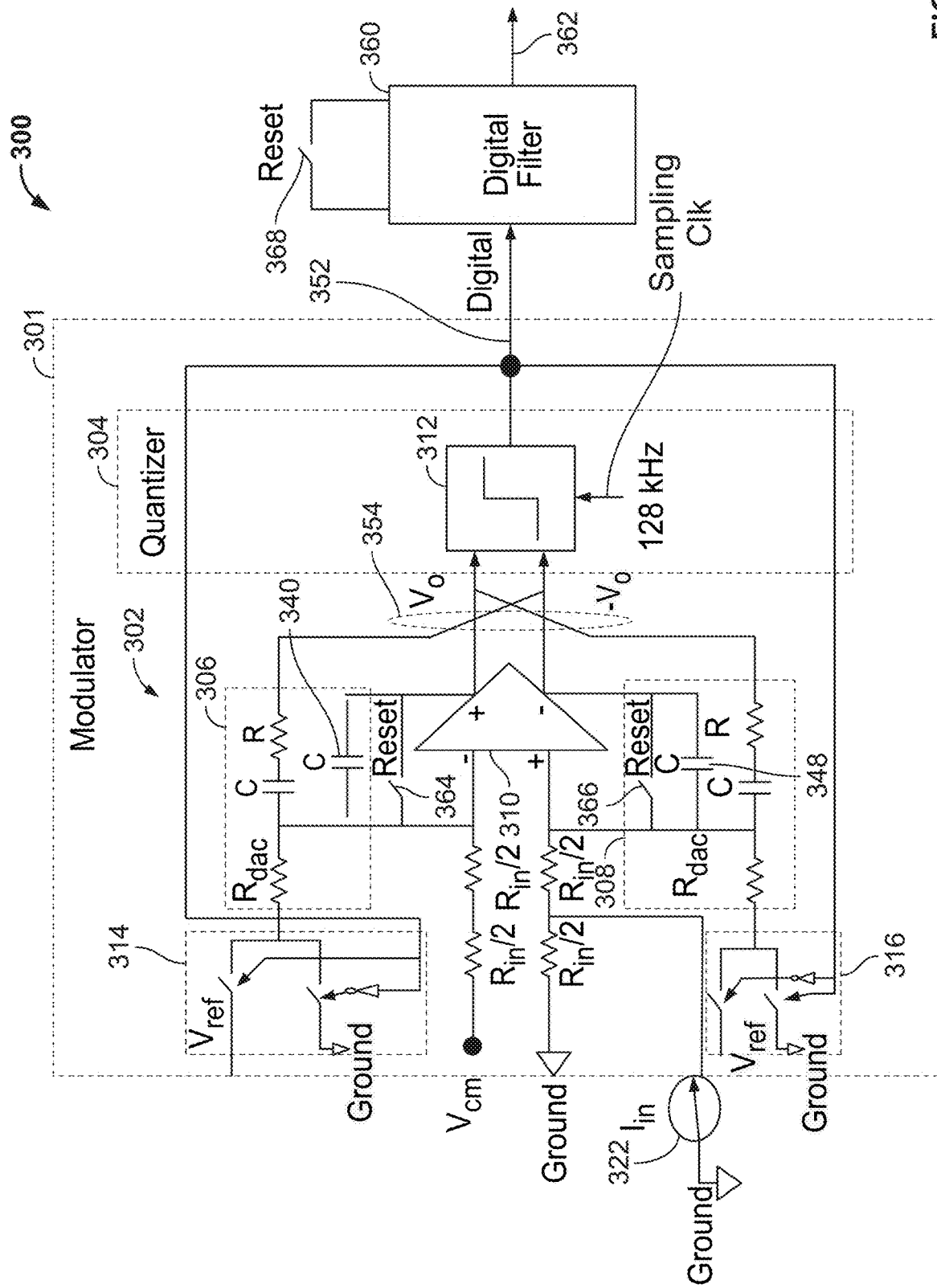
FIG. 3 shows a current-converting modulator system in accordance with at least some exemplary disclosures.

FIG. 3 shows a current-converting modulator system in accordance with various exemplary disclosures. In FIG. 3, a current-converting modulator system 300 is shown in accordance with a disclosed embodiment. In accordance with an embodiment, modulator system 300 includes a modulator 301 and a digital filter 360. The modulator 301 has a resonator 302 and a quantizer 304, in an embodiment.

Modulator system 300 receives a current-varying input 368 and in response to the input 368, generates a digital word 362 proportional to the variances in the input 368. Current-varying input 268 may be generated by a current-producing device 322, such as, without limitation, a temperature sensor. The sensor, or input to the modulator 201, behaves like a current source, producing current-varying signals in response to a behavioral or environmental change in a sensed device, such as, without limitation, a gyroscope. It is understood that the current-producing device 322 may be any type of sensor, including, without limitation, a motion, pressure, acoustic, or other types of current-producing sensors.

In some embodiments, modulator system 300 is configured analogously to modulator system 200 except that the former is equipped with a reset feature. More specifically, in the configuration of FIG. 3, resonator 302 includes a reset switch 364 coupled across an amplifier 310 and in parallel with feedback capacitor 340. Resonator 302 may also include a reset switch 366 coupled across amplifier 310 and in parallel with feedback capacitor 348. Additionally, quantizer 304 includes a reset switch 368 coupled to switch an output of a digital filter 360, a digital word 362.

Modulator 301 is commonly referred to as an incremental modulator. In operation, before the start of each conversion time, switches 349, 348, and 368 are switched to a closed position and then switched to an open position to reset the system. In the closed position, the capacitors of corresponding switches are shorted, and in an open position, the capacitors are no longer shorted. More specifically, before each conversion time, switches 340, 348, and 368 are closed, and capacitors 340 and 348 are shorted, effectively discharging the capacitors, and digital word 364 is reset. All three switches are then opened, still before the start of the next conversion time. Other system switches, not shown in figures or discussed herein, may also be switched closed and opened. At this time, the system is reset, effectively resetting the memory of modulator system 300. After the switches are opened, the next conversion time begins, and the sampling clock starts to sample current-converted voltages at voltage output 354. The conversion period proceeds as described relative to FIG. 2. At the end of the conversion period, the system is reset again, and the reset process continues to repeat between conversion times.

In an embodiment, for proper operation, a sigma-delta modulator, such as modulator 201 of FIG. 2, may require a "Sinc" filter. "Sinc" represents "Sinus Cardinal." Whereas, an incremental modulator, such as modulator 301 of FIG. 3, may require only accumulators. Accordingly, digital filter 260 (FIG. 2) may include a Sinc filter and digital filter 360 (FIG. 3) may require two accumulators. The reason each modulator type requires a different filter has to do with the structure of the quantization noise and noise aliasing effects.

In either or both modulator embodiment examples of FIGS. 2 and 3, the modulator (201, 301) and sensor (222, 322) may reside in a common integrated circuit. For example, device 322 and modulator system 300 may reside on the same chip. Alternatively, device 322 and modulator system 300 may reside on the same chip, and digital filter 360 may reside externally thereto. Other combinations of components shown in the system 300 or the system 200 may reside on a common semiconductor device.

Figure 4:
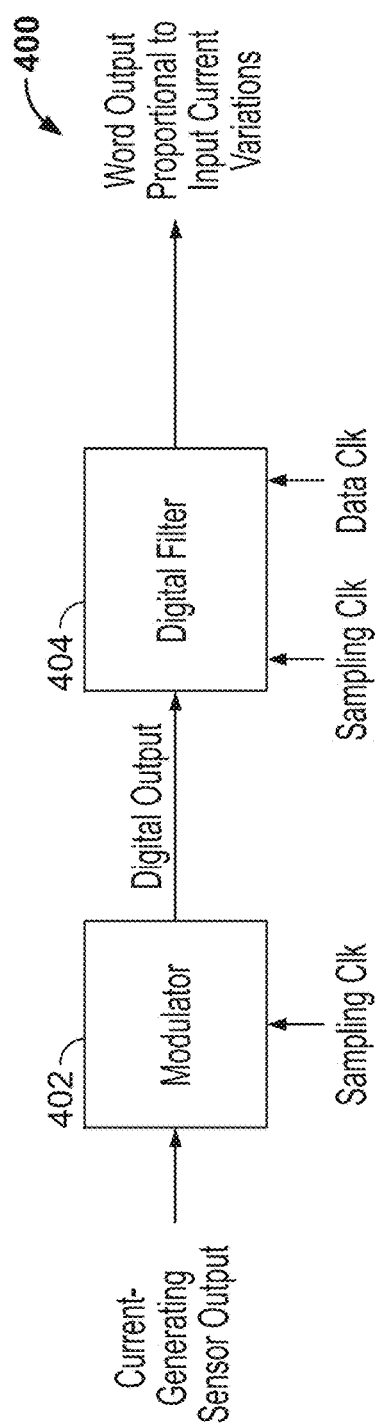
FIG. 4 shows a current-converting modulator system in accordance with at least some exemplary disclosures.
Figure 5:
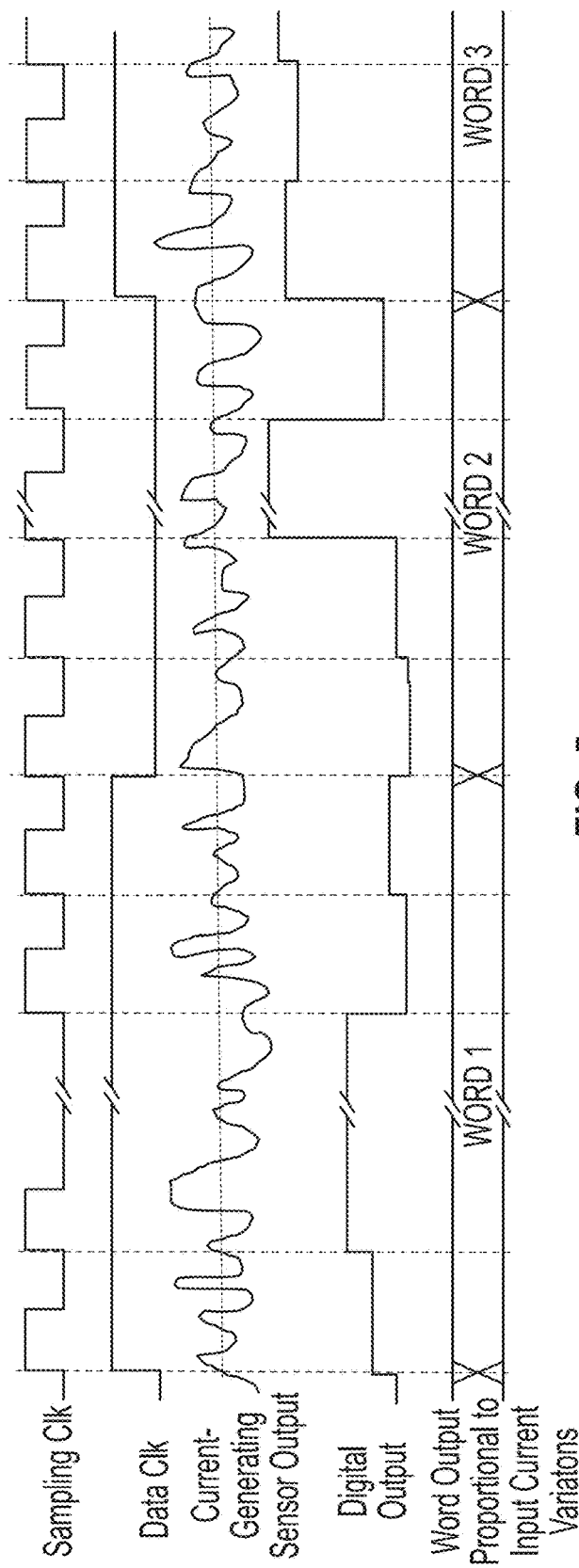
FIG. 5 is a timing diagram of the current-varying modulator system, in at least one exemplary functional behavior of the system.

FIG. 4 shows a current-converting modulator system in accordance with various exemplary disclosures. In FIG. 4, a current-converting modulator system 400 is shown in accordance with a disclosed embodiment. FIG. 5 is a timing diagram of the current-varying modulator system 400 in an exemplary functional behavior of the system 400. In accordance with exemplary disclosures, system 400 is analogous to system 200 and system 300 of FIGS. 2 and 3, respectively. The timing behavior of system 400 is discussed below using FIG. 5 relative to the description of system 400 in FIG. 4. It is understood that the discussion of FIGS. 4 and 5 is by no means limited to the embodiments shown and discussed relative to FIGS. 2 and 3 and that the latter serve as one of many other modulator systems.

With reference to FIG. 4, a modulator 402 of system 400 receives a current-generating sensor output from a current-producing device. The sensor output is an analog signal carrying small-varying current, as shown by the corresponding sensor output timing behavior in FIG. 5. The small-varying current may represent behavioral variations like, without limitation, changes in temperature or displacement of a device.

Modulator 402 converts the sensor output to voltage levels with voltage level changes reflecting variations in the sensor output current by use of a resonator circuit configured like the resonators of FIGS. 2 and 3. The voltage level outputs are compared to one or more threshold values to generate a quantized digital output at each sampling clock with a sampling clock timing, as shown in FIG. 5. In FIG. 4, digital outputs are provided by modulator 402 to a digital filter 404 at each sampling clock over a conversion time of many sampling clocks. FIG. 5 shows the timing behavior of the digital outputs. The digital output may be one or more bits based on the quantization granularity. The sequence of data output is accumulatively added and output as a digital word at a sampling clock rate by digital filter 404, similar to the operation of various digital filters shown and discussed relative to FIGS. 2 and 3.

As shown in FIG. 5, the sampling clock rate is typically orders of magnitude faster than the data clock rate. For example, the digital outputs may be provided to digital filter 404 at a rate of 128 kHz, whereas the digital filter 404 generates digital words every 640 sampling clocks, by oversampling.

Figure 6:
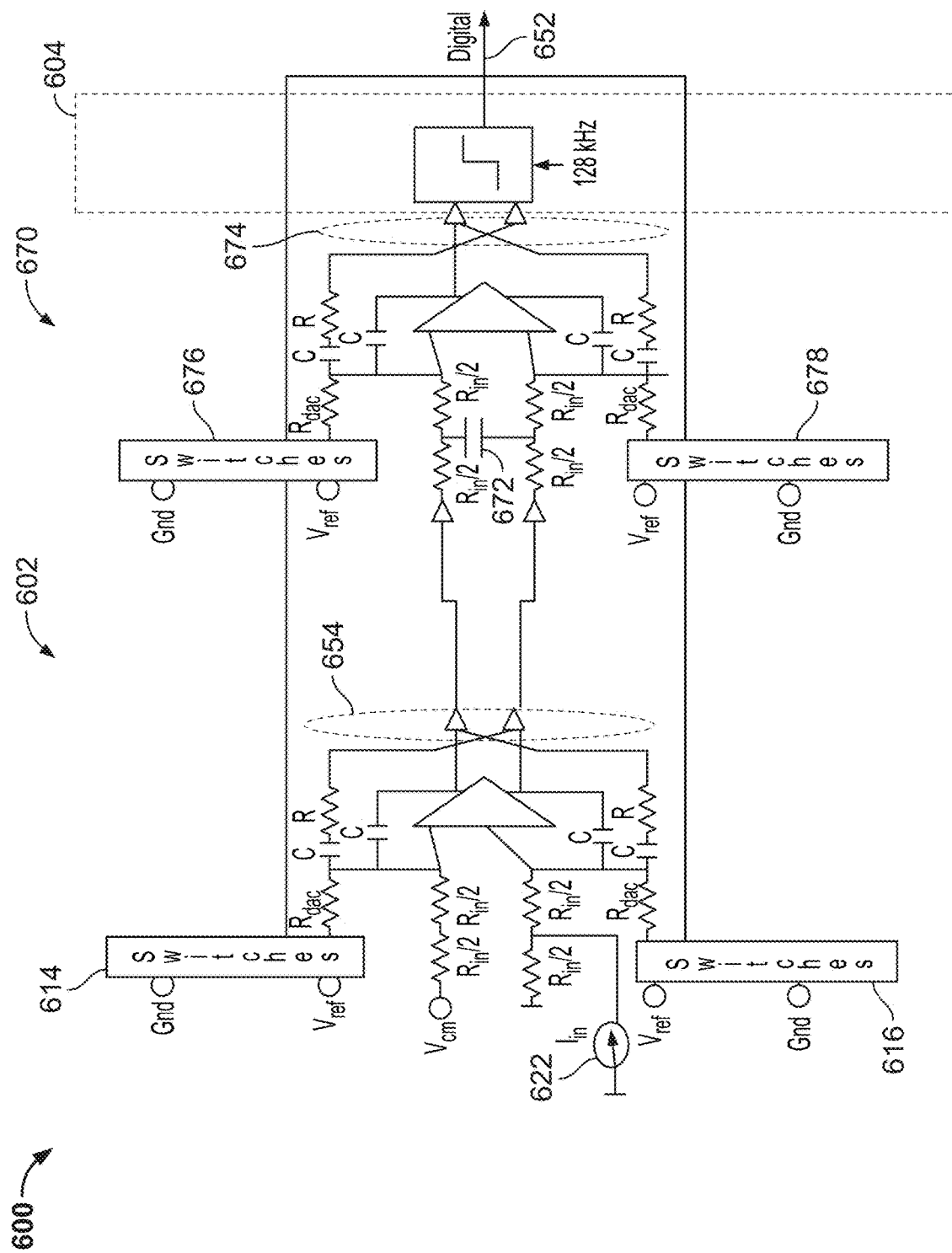
FIG. 6 shows a current-converting modulator system in accordance with at least some exemplary disclosures.

FIG. 6 shows a current-converting modulator in accordance with various exemplary disclosures. In FIG. 6, a current-converting modulator 600 is shown in accordance with a disclosed embodiment. Modulator 600 is an example of a cascaded resonator configuration and may include two or more resonators. For the purpose of simplicity of illustration, modulator 600 is shown to include two resonators, a resonator 602 and a resonator 670. Each of the resonators 602 and 670 includes switches and circuits configured similar to the switch and circuits configuration of each of the resonator embodiments of FIGS. 2 and 3. The rate at which the system converges to the digital word is based, at least in part, on the total number of cascaded resonators.

Resonators 602 and 670 are coupled in series where a voltage output 654 of resonator 602 is coupled to the input of resonator 670. Voltage output 654 is a differential output with two complementary voltages, as discussed with reference to previous embodiments. Each of the voltages of voltage output 654 feeds an input of resonator 670 through a respective input circuit analogous to the input circuits of FIGS. 2 and 3. Similar to the resonators of FIGS. 2 and 3 and resonator 602, the inputs of resonator 670 are complimentary. But the resonator 670 inputs are coupled together with a noise cancellation capacitor 672 for reducing the noise generated between the two resonators.

Digital output 652 of quantizer is presumed to be a one-bit quantizer for clarity of illustration. Digital output 652 controls switching of four total number of switches, 614, 616, 676, and 678. Digital output 652 controls the switching of a set of switches 614, 616 of resonator 602 in accordance with a complimentary configuration relative to each other, and further controls the switching of a set of switches 676, 678 of resonator 670 in accordance with a complimentary configuration relative to each other.

The last resonator of a cascaded resonator modulator embodiment is coupled to a one- or multi-bit quantizer. In the embodiment of FIG. 6, output voltage 674 of resonator 670 is provided to quantizer 604, which may be one- or multi-bit. Quantizer 604 digitizes voltage output 674, generating a digital 652 output every sampling clock. The digital outputs are received by a digital filter (not shown in FIG. 6), as discussed relative to FIGS. 2 and 3.

Figure 7:
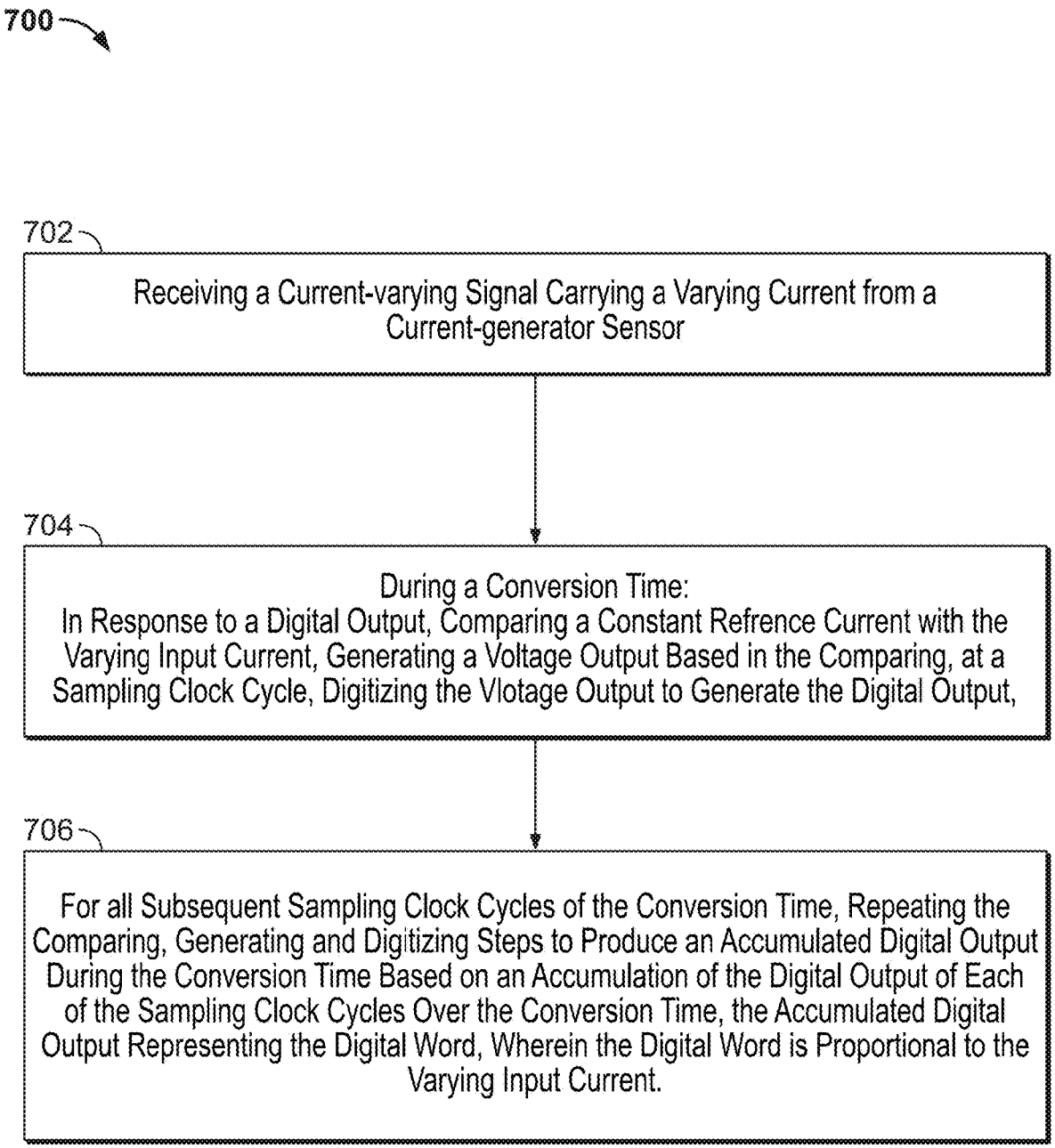
FIG. 7 is a flowchart of an exemplary process for converting a current-varying input to digital form in accordance with at least some embodiments of the present disclosure.

FIG. 7 is a flowchart of an exemplary process for converting a current varying input to digital form in accordance with at least some embodiments of the present disclosure. In FIG. 7, a flowchart is presented of an exemplary process 700 for converting a current-varying input to digital form in a MEMS system in accordance with at least some embodiments of the present disclosure. Although a particular order and flow of steps is depicted in FIG. 7, it will be understood that in some embodiments one or more of the steps may be modified, moved, removed, or added, and that the flow depicted in FIG. 7 may be modified. The process described relative to FIG. 7 may be performed by the modulator systems (or modulator) of previous figures or by other suitable modulator systems.

FIG. 7 will now be described relative to the embodiment of FIG. 2. In FIG. 7, at step 702, a modulator system receives a current-varying signal, such as input 268 (FIG. 2), from a current-producing sensor device. Next, at step 704, during a conversion time, a constant reference current, such as Iref in FIG. 2, is compared to the current-varying signal by a resonator, such as resonator 202 of FIG. 2, by an amplifier of the resonator, such as amplifier 210. Further, at step 704, at a sampling clock cycle, the output of the amplifier, a voltage output, such as voltage output 252, which is proportional to the difference in current between the reference current and the current-varying signal and the voltage output is digitized, generating the digital output at a sampling clock cycle. At step 706, for subsequent sampling clock cycles of the same conversion time, the comparing, generating, and digitizing of steps 704 are repeated to produce an accumulated digital output based on an accumulation of the digital output at each sampling clock cycle until the end of the conversion time is reached. The accumulated digital output is a digital word that is proportional to the varying input current.

The foregoing description includes exemplary embodiments in accordance with the present disclosure. These examples are provided for purposes of illustration only and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A system for converting a current-varying sensor output to a digital representation, the system comprising:
   a resonator having a first resonator input and a second resonator input, the first resonator input carrying a constant reference current and the second resonator input carrying a varying input current, the resonator, in response to a digital output, configured to generate a complementary voltage output based on a difference between the constant reference current and the varying input current during a conversion time,
wherein the resonator resonates near or at zero frequency, and
further wherein an accumulated digital output is based on accumulation of the digital output generated at each sampling clock cycle of the conversion time and represents a digital word proportional to the varying input current.

2. The system of claim 1, further comprising a quantizer configured to generate the digital output at each of the sampling clock cycles by digitizing the complementary voltage output at each data clock cycle.

3. The system of claim 2, wherein the quantizer is an N-bit quantizer, "N," representing a value and up to a number of states represented by the digital word.

4. The system of claim 3, wherein a rate of convergence of the digital word is based on the value of N.

5. The system of claim 1, further comprising one or more accumulators configured to generate the digital word by adding the digital output of each of the data clock cycles of the conversion time to each other.

6. The system of claim 1, wherein the resonator further comprises:
an amplifier circuit having a first amplifier input and a second amplifier input, the first amplifier input coupled to the first resonator input and a first switching circuit that switches between a reference voltage and a ground in response to the digital output, the second amplifier input coupled to the second resonator input and a second switching circuit that switches between the reference voltage and the ground in response to the digital output,
wherein when the digital output causes the first switching circuit to switch to the reference voltage, the digital output causes the second switching circuit to switch to the ground, and when the digital output causes the second switching circuit to switch to the reference voltage, the digital output causes the first switching circuit to switch to the reference voltage.

7. The system of claim 6, wherein the reference voltage is approximately half of a supply voltage.

8. The system of claim 6, wherein the amplifier circuit is a chopper amplifier.

9. The system of claim 6, wherein the resonator further comprises a first resistor-switch combination and a second resistor-switch combination, wherein each of the first and second resistor-switch combinations effectively forms a digital-to-analog (DAC) and a number of resistor-switch combination pairs is based, at least in part, on "N".

10. The system of claim 9, wherein each of the first and second resistor-switch combinations comprises a resistor coupled to a respective one of the first or second switching circuits.

11. The system of claim 1, further including a quantizer configured as a successive approximation (SAR) analog-to-digital converter (ADC).

12. The system of claim 1, wherein the resonator further comprises a first circuit coupled to the first resonator input and a second circuit coupled to the second resonator input, the first and second circuits each including circuit components matched between the first and second circuits to cause the resonator to generate two complementary voltage outputs on the complimentary voltage output.

13. The system of claim 12, wherein the first circuit includes a first digital-to-analog (DAC) resistor coupled to the first resonator input and the second circuit includes a second DAC resistor coupled to the second resonator input, wherein the first and second DAC resistors are matched to each other defining a dynamic range of the resonator.

14. The system of claim 12, wherein each of the first and second circuits includes one or more resistors and one or more capacitors wherein corresponding resistors are matched between the first and second circuits, and corresponding capacitors are matched between the first and second circuits.

15. The system of claim 12, wherein each of the first and second circuits includes at least one feedback capacitor, and each of the feedback capacitors is switched on and off during each data clock cycle to charge and discharge a corresponding feedback capacitor, respectively.

16. The system of claim 1, wherein the resonator further comprises a voltage divider circuit, and a current divider circuit, the voltage divider circuit configured to generate a modified common-mode voltage proportional to the constant reference current and the current divider circuit is configured to generate an input voltage proportional to the varying input current.

17. The system of claim 16, wherein each of the voltage divider circuit and the current divider circuit includes a set of resistors, the set of resistors of the voltage divider circuit, and the set of resistors of the current divider circuit matched to each other.

18. The system of claim 16, wherein the voltage divider circuit is configured to divide a common-mode voltage to generate the modified common-mode voltage.

19. The system of claim 18, wherein the common-mode voltage is equal to a reference voltage proportional to the constant reference current.

20. The system of claim 18, wherein the common-mode voltage is equal to a reference voltage that is proportional to the constant reference current.

21. The system of claim 1, wherein the resonator is configured to reset before the conversion time.

22. The system of claim 1, wherein accuracy of the digital word is based, at least in part, on a number of sampling clock cycles during the conversion time.

23. The system of claim 1, wherein the varying input current is from a single-ended source.

24. The system of claim 1, wherein the constant reference current is approximately a mid-point in a current range of the current-varying sensor output.

25. The system of claim 1, further comprising a plurality of resonators coupled in a cascade configuration, wherein a rate at which the system converges to the digital word is based on a total number of cascaded resonators.

26. A method comprising:
receiving a current-varying input from a current-generating sensor;
during a conversion time:
in response to a digital output, comparing a constant reference current with the varying-varying input,
generating a complementary voltage output based on the comparing,
at a sampling clock cycle, digitizing the voltage output to generate the digital output,
for all subsequent sampling clock cycles of the conversion time, repeating the comparing, generating, and digitizing steps to generate a digital word based on an accumulation of the digital output of each of the sampling clock cycles over the conversion time, the accumulated digital output representing the digital word, wherein the digital word is proportional to the current-varying input.

27. The method of claim 26, further comprising generating the digital output at each of the sampling clock cycles by digitizing the complementary voltage output at each of the sampling clock cycles.

28. The method of claim 26, wherein digitizing the complementary voltage output at each sampling clock cycle over the conversion time causes generating the digital word, wherein the digital word is one- or multi-bit.

29. The method of claim 26, further comprising generating the digital word by accumulating the digital output at each of the sampling clock cycles of the conversion time.

30. The method of claim 26, wherein the digital output controls switching of a first set of switches and further controls switching of a second set of switches, the first set of switches and the second set of switches caused to switch by the digital output in a complementary switching configuration based on a result of the comparing.

31. The method of claim 26, further including generating the digital word at a data clock rate significantly lower than a sampling clock rate of the sampling clock cycles to cause oversampling of the input current.

\* \* \* \* \*